United States Patent [19]

Ohta et al.

[11] Patent Number: 5,225,245

[45] Date of Patent: Jul. 6, 1993

[54] CHEMICAL VAPOR DEPOSITION METHOD FOR FORMING THIN FILM

[75] Inventors: Tomohiro Ohta; Eiichi Kondoh; Tohru Mitomo; Kenichi Otsuka; Hiroshi Sekihashi, all of Chiba, Japan

[73] Assignee: Kawasaki Steel Corporation, Kobe, Japan

[21] Appl. No.: 568,857

[22] Filed: Aug. 17, 1990

[30] Foreign Application Priority Data

Dec. 1, 1989 [JP] Japan .................................. 1-312509
Feb. 20, 1990 [JP] Japan .................................. 2-39495

[51] Int. Cl.$^5$ ............................................ C23C 16/00
[52] U.S. Cl. .................................. 427/248.1; 427/249; 427/314

[58] Field of Search ...................... 427/249, 38, 8, 314, 427/398.1, 252, 253, 248.1

Primary Examiner—Bernard Pianalto
Attorney, Agent, or Firm—Oliff & Berridge

[57] ABSTRACT

An apparatus for forming, by a chemical vapor deposition process, a thin film of crystals such as diamond on a surface of a heated substrate placed in a reaction vessel. The apparatus has a substrate supporting structure, a heater for heating the substrate by heat conduction or by electric current supplied directly to the substrate, and a cooling device for cooling the substrate. The heater is controlled in accordance with the measured temperature of the substrate so as to accurately maintain the substrate temperature at a constant level.

3 Claims, 5 Drawing Sheets

CHEMICAL VAPOR DEPOSITION METHOD FOR FORMING THIN FILM

FIELD OF THE INVENTION

The present invention relates to an apparatus for forming a thin film by chemical vapor deposition (abbreviated as "CVD" hereinafter). More particularly, the present invention is concerned with a chemical vapor deposition apparatus suitable for forming a thin film of diamond, silicon, silicon dioxide, alumina, silicon carbide, silicon nitride, boron nitride and so forth.

DESCRIPTION OF THE RELATED ART

In recent years, thin films of diamond, silicon and so forth are finding increasing applications in various fields such as semiconductors, tools, machine parts, composite materials, nuclear plant components, and so on.

Consequently, the increase in applications has necessitated the need for higher quality films with dimensional stability. Many studies have been made for development of techniques for obtaining thin films of uniform quality and thickness.

For instance, in case of vapor deposition of diamond, various methods have been proposed, for example, a hot filament CVD method disclosed in Japanese Examined Patent Publication No. 59-27753, a plasma CVD method of substrate heating type as disclosed in Japanese Unexamined Patent Publication No. 58-156594, a microwave plasma CVD method as disclosed in Japanese Examined Patent Publication No. 59-27754, and a cooling microwave plasma CVD method disclosed in Japanese Examined Patent Publication No. 62-21757.

Meanwhile, Kaneko et al. discloses the production of thin films by methods of hot filament type, substrate heating type and cooling type, at pp 546–552, Applied Surface Science Vol. 33/34 (1988).

In the hot filament method disclosed in Japanese Examined Patent Publication No. 59-27753, a filament is heated to about 2000° C. so as to decompose a source gas thereby producing active species which contribute to deposition of diamond. It is therefore necessary that a substrate is disposed within the reach of the active species. Usually, a hot filament is disposed at a position which is several millimeters from the substrate, so that the substrate receives a large quantity of heat radiated from the filament. It is therefore extremely difficult to maintain a given constant temperature of the substrate surface.

The microwave plasma CVD method disclosed in Japanese Examined Patent Publication No. 59-27754 has difficulty in accurately controlling the substrate temperature, because the substrate temperature varies due to various factors including variations in the characteristics of plasma and variations in the configuration and material of the substrate.

The microwave plasma CVD method disclosed in Japanese Unexamined Patent Publication No. 58-156594 is intended to obviate the problems mentioned above, and employs means for heating the substrate thereby to control the substrate temperature. This method, relying upon positive heating of the substrate, can effectively be applied to the microwave plasma CVD method in which the substrate receives only a small quantity of heat from the substrate, but is not suitable in other methods in which the substrate receives a large quantity of heat, such as the hot filament CVD method, plasma jet method and combustion flame method.

Japanese Examined Patent Publication No. 62-21757 proposes a CVD method in which the substrate temperature is controlled by cooling the substrate using a coolant. This method, however, is unsatisfactory in that the substrate temperature is controllable only over a limited range and in that the temperature control cannot be conducted with a good response.

Thus, all these known CVD methods suffer from disadvantages in that the substrate temperature is controllable only in a limited temperature range and in that the temperature control cannot be effected with good response. It is understood that a technique for controlling the substrate temperature is quite an important factor in the vapor deposition of diamond, for which no technique has been established for satisfactorily controlling the substrate temperature.

SUMMARY OF THE INVENTION

Accordingly, an object of the present invention is to provide a chemical vapor deposition apparatus for forming a thin film, capable of overcoming the above-described problems of the prior art.

To this end, according to the present invention, there is provided an apparatus for forming, by chemical vapor deposition, a thin film on the surface of a heated substrate placed in a vessel, the apparatus comprising: gas supplying and exhausting means for supplying a source gas into the vessel and exhausting the gas from the vessel; decomposing means for decomposing the source gas; substrate supporting means for supporting the substrate; substrate cooling means for cooling the substrate; substrate heating means for heating the substrate; substrate temperature measuring means for measuring the temperature of the substrate; and substrate temperature control means for controlling the temperature of said substrate.

The above and other objects, features and advantages of the present invention will become clear from the following description.

DESCRIPTION OF THE PREFERRED EMBODIMENTS

The invention will be described in more detail with reference to the drawings.

Figure 1:
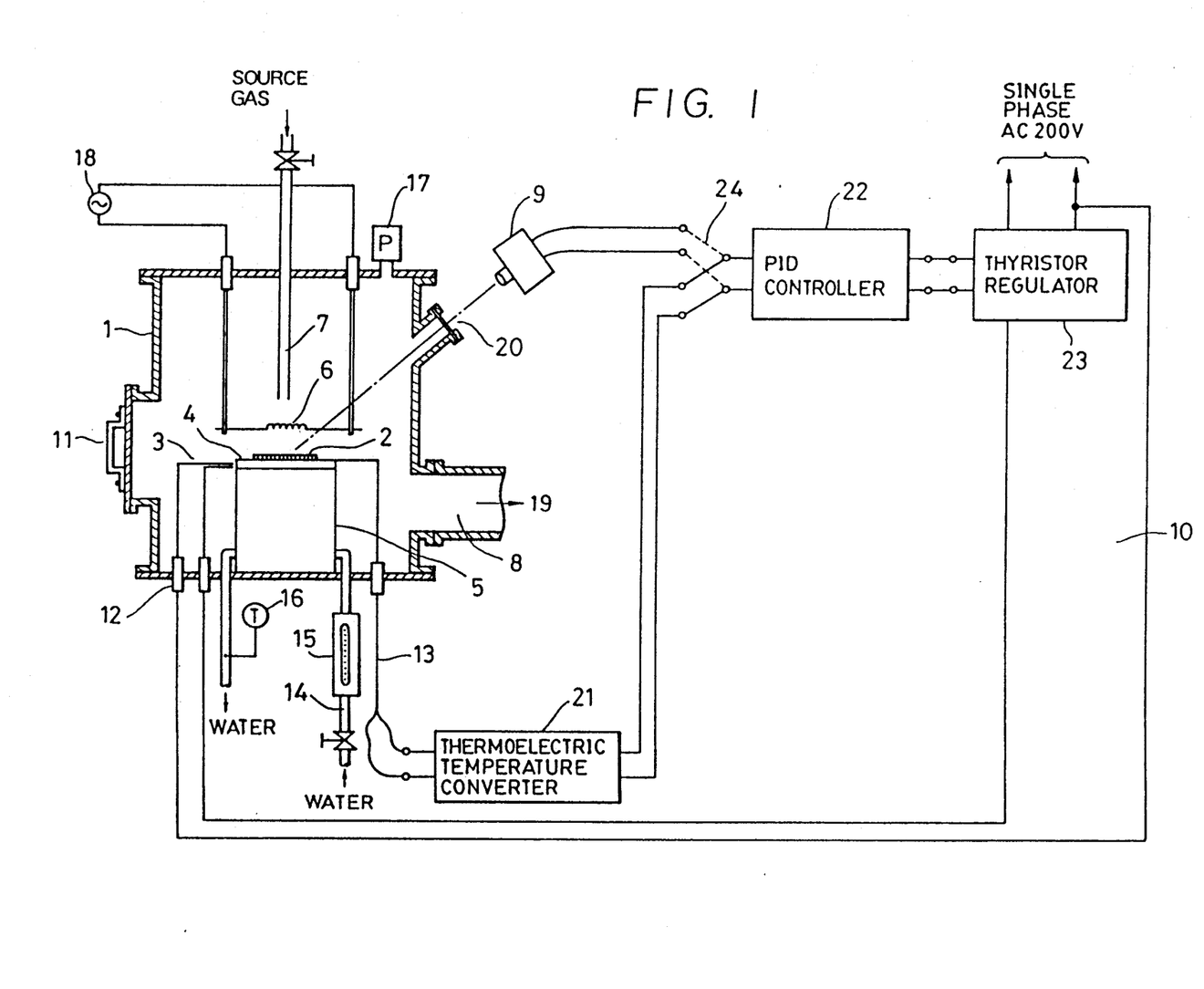
FIG. 1 is a schematic illustration of an embodiment of a chemical vapor deposition apparatus of the invention for forming a thin film.

FIG. 1 is a schematic illustration of an embodiment of the apparatus of the present invention, applied to a system for forming a thin film by chemical vapor deposition employing a hot filament.

The present inventors have discovered the following facts in the course of a further study. Namely, the inventors have found that a relationship as shown in FIG. 5 exists between the substrate temperature and the rate of growth of diamond, as well as the quality of the crystal.

Figure 5:
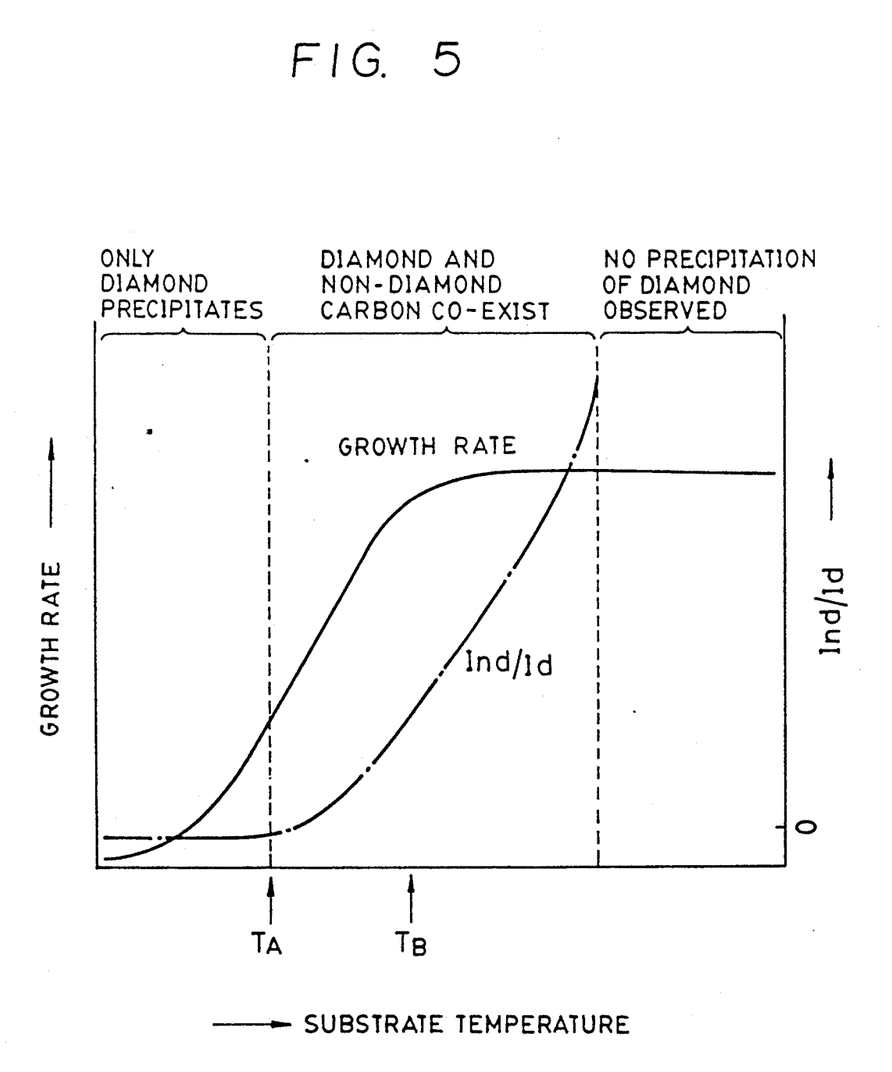
FIG. 5 is a diagram showing the relationship between the substrate temperature and the growth rate and the quality of the diamond thin film.

In FIG. 5, the quality of the crystal is expressed in terms of a ratio Ind/Id between the peak intensity Ind of non diamond carbon as impurity and the peak intensity Id of diamond, the peak intensities being determined through Raman spectral analysis of the deposited diamond. Thus, a smaller value of the ratio Ind/In indicates better quality of the diamond crystal.

From FIG. 5, it is understood that the growth rate and the purity of the diamond can be freely controlled by suitably setting the substrate temperature. For instance, a diamond of a high purity can be deposited at a low substrate temperature $T_A$, whereas deposition at a substrate temperature $T_B$ enables diamond to deposit at a high growth rate although the purity is slightly reduced. Thus, in the CVD process for depositing diamond, it is necessary that the substrate temperature is controlled over a wide range and with good accuracy, in order to obtain a desired quality and growth rate of crystal.

For instance, when the substrate temperature which has been maintained at $T_A$ during deposition is shifted to a higher temperature for any reason, the purity of the diamond is seriously decreased. Conversely, when the substrate temperature is shifted to a lower temperature from $T_B$ during the deposition, the crystal growth rate is lowered to make it impossible to obtain the required amount of deposition within a given time. Thus, minimization of fluctuation of the substrate temperature during deposition also is a very important factor.

The apparatus has a reaction vessel 1 provided with a pressure gauge 17. The reaction vessel 1 accommodates a substrate supporting device 3 for supporting a substrate 2 on which a thin film is to be formed by deposition. The reaction vessel 1 also is provided with a work port 11 through which the substrate 2 is brought into and out of the reaction vessel 1. The substrate supporting device 3 includes heating means 4 for heating the substrate 2 and a cooling means 5 under the heating means 4.

The heating means 4 includes a thermocouple 13 and is capable of heating the substrate 2 when supplied with electric power through power terminals 12, while the cooling means 5 includes a cooling pipe 14 for circulating cooling water, a flowmeter 15 and a thermometer 16 for cooling water.

The reaction vessel 1 also is provided at its upper or lower portions with a source gas supply port 7 and a gas exhaust port 8. A source gas such as $CH_4$ gas diluted with $H_2$ gas is introduced into the reaction vessel 1 through the source gas supply port 7 and is subjected to decomposition and the resultant gas is exhausted through the exhaust port 8 by means of a vacuum pump 19. In order to thermally decompose the source gas, a hot filament 6 is disposed in the reaction vessel 1 which filament is connected to a power supply 18.

In this case, a plasma may be used in place of the filament, as the decomposing means for decomposing the source gas.

It is possible to provide a non-contact type thermometer 9, e.g., a radiation pyrometer, outside the reaction vessel 1 to enable measurement of the substrate temperature through a window 20 attached to the wall of the reaction vessel 1.

The apparatus has temperature control means 10 which includes, for example, a thermocouple voltage converter 21, a PID controller 22 and a thyristor regulator 23 for controlling the electric power supplied to the substrate heating means 4. The temperature controller 10 controls the operation of the heating means 4 in accordance with the substrate temperature measured by the non-contact type thermometer 9 or the thermocouple 13, thereby controlling the substrate temperature in combination with the cooling means 5. A switch 24 is provided for enabling change-over between the thermocouple 13 and the non-contact thermometer 9.

The described arrangement in the apparatus of the present invention enables a control of the substrate temperature over a much wider temperature range than in known apparatuses in which the substrate temperature is controlled solely by heating or cooling. In normal operation of this apparatus, both the electric power and the cooling water are simultaneously supplied and the level of the electrical current is varied in accordance with a change in the substrate temperature, thereby maintaining the substrate temperature at a constant level. According to this method, the substrate temperature can be controlled with much higher response speed and much better accuracy than in the case where the substrate temperature is controlled through a control of flow rate of the cooling water. In addition, there is no risk of boiling of the cooling water because a certain sufficient flow rate of the cooling water is maintained.

Figure 2:
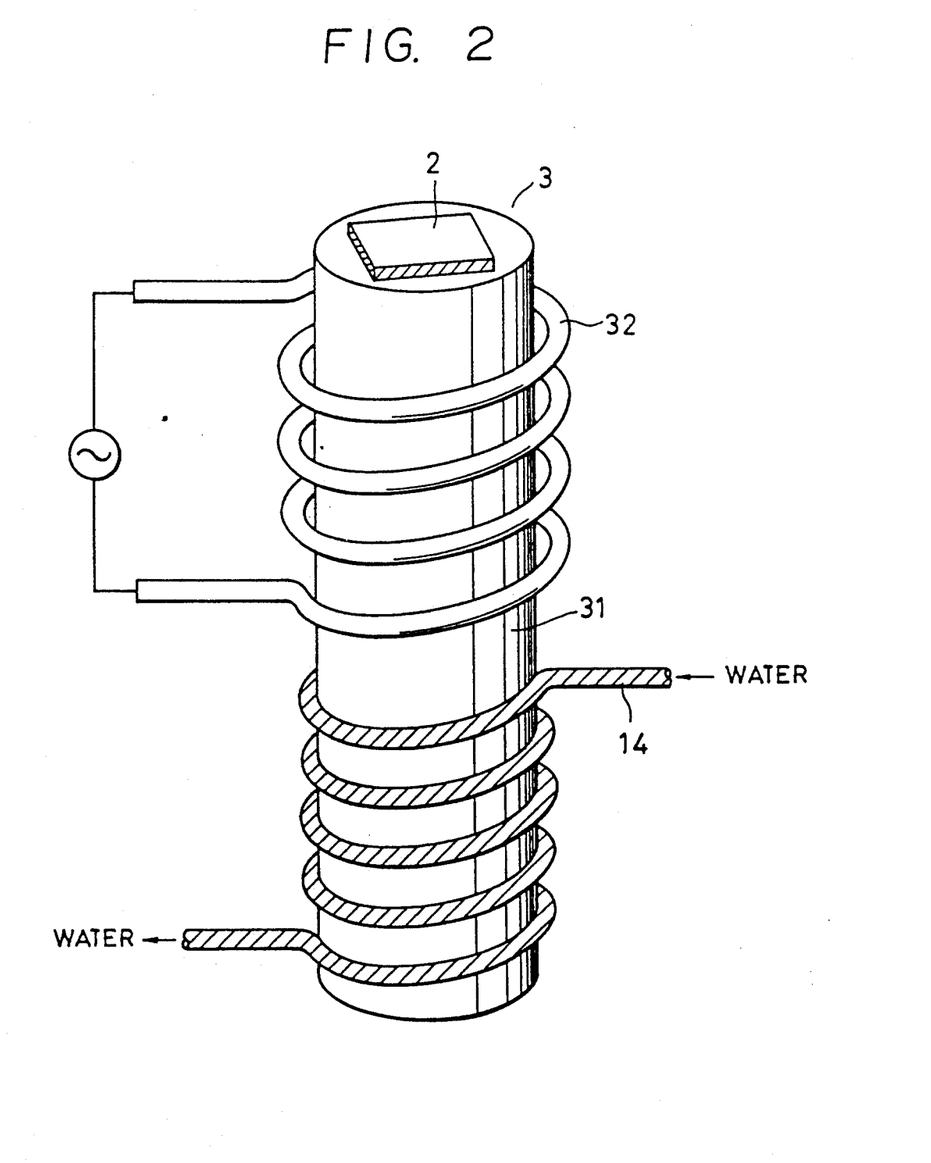
FIG. 2 is a schematic perspective view of a substrate supporting device with a temperature controller, used in another embodiment of the present invention.

Another embodiment of the present invention, having a substrate supporting device 3, heating means 4 and cooling means 5 different from those in the first embodiment, will be described with reference to FIG. 2 which is a schematic perspective view of this embodiment.

In this embodiment, the substrate supporting device 3 for supporting a substrate 2 is a metal bar 31 on an upper portion of which is provided an RF heating coil 32 as the heating means 4, while a cooling water pipe 14 as the cooling means 5 is provided on a lower portion of the metal bar 31 by silver brazing.

As a result of a study described below, the present inventors also have considered an arrangement in which a substrate is held by a power supply holder which also serves as electrodes, the holder holding the substrate being placed in a reaction vessel of a reduced pressure so that an electric current is supplied through the power supply holder so as to heat the substrate.

Namely, the inventors prepared test pieces of silicon substrates 50 mm long and 10 mm wide. The inventors connected electrodes to both ends of the test piece and supplied electric current to the test piece through these electrodes. The test piece was not red-heated at all when the voltage applied is still low. However, when the voltage applied was raised to 100 V, the substrate test piece was suddenly red-heated while drastically reducing its resistance from several kΩ to several Ω or below. It was confirmed through a measurement by a radiation pyrometer that the substrate surface temperature can be raised up to 1300° C. by this method. In addition, the substrate test piece was uniformly red-heated over the entire portion thereof and enabled accurate measurement of the surface temperature. It was also confirmed that the temperature control can be done in a stable manner because the power supply holder, which will be detailed later, can stably hold the substrate without substantial change in the resistances at the contacts between the holder and the substrate.

This apparatus will be described in detail with reference to FIG. 3.

Figure 3:
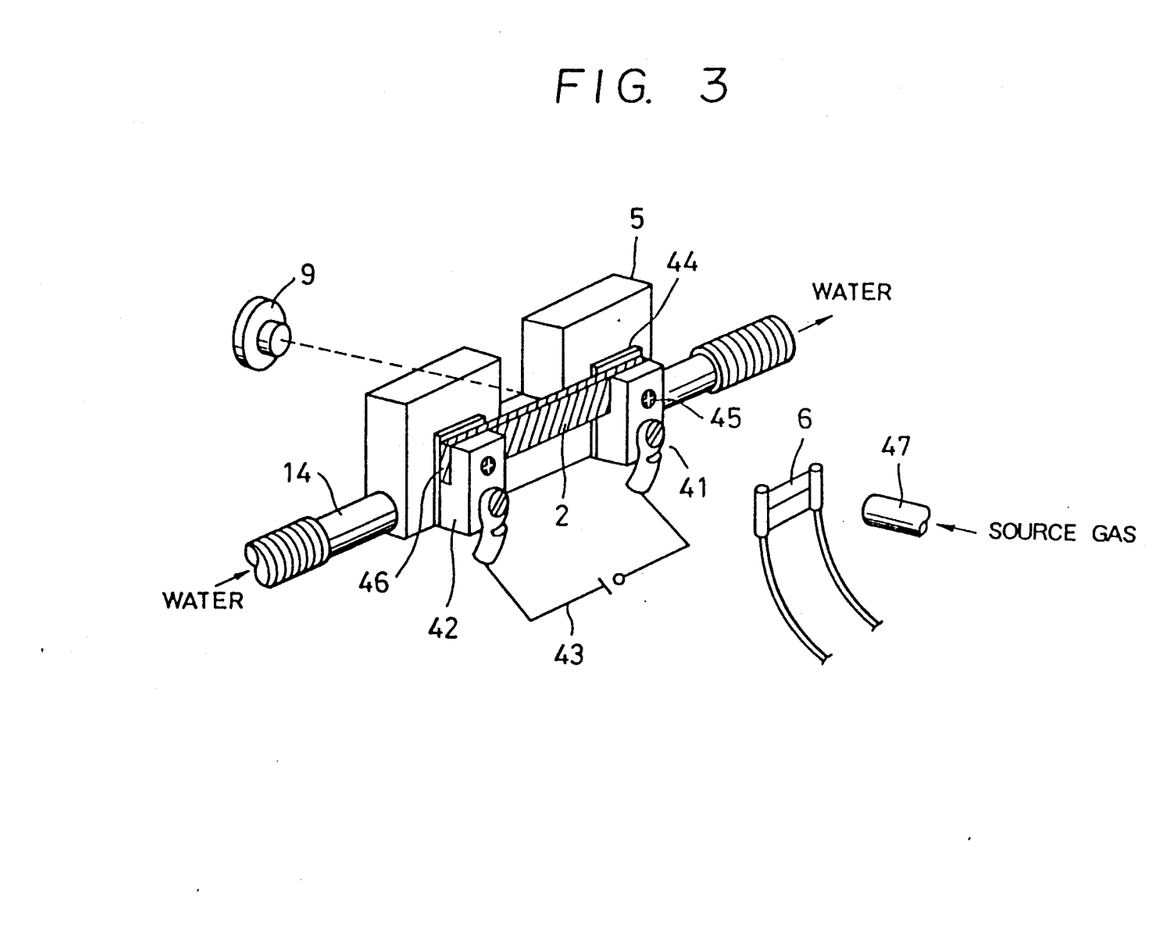
FIG. 3 is a schematic illustration of an electric power supply holder with a temperature controller, used in still another embodiment of the present invention.

Referring to FIG. 3, the apparatus employs a hot filament 6 for thermally decomposing the source gas. The apparatus also has a heating electric power supply 43 for supplying electric power which heats the substrate 2. A power supply holder 41 includes a power supply electrode 42 and an insulating means 44 for insulating the cooling means 5 from the substrate 2 and the power supply electrodes. The power supply holder 41 is capable of holding the substrate 2 and supplying the substrate 2 with an electric current from the heating electric power supply 43. The apparatus also has cooling means 5 which is held in contact with the power supply electrodes 42 through the insulating means 44. Numeral 47 designates a nozzle made of quartz which corresponds to the source gas supply port 7 and is capable of introducing the source gas into the zone near the surface of the substrate 2. Numeral 9 denotes a radiation pyrometer capable of measuring the substrate temperature in a non-contacting manner. These components, except the radiation pyrometer, are encased in a reaction vessel as in the case of the embodiment shown in FIG. 1. The substrate 2 is disposed in the reaction vessel 1 such that its major surfaces are held vertically. This, however, is not exclusive and the power supply holder 41 and other components may be arranged horizontally so that the major surfaces of the substrate 2 extend substantially horizontally as in FIG. 1.

The aforementioned radiation pyrometer 9 is disposed to oppose the reverse side, i.e., the side opposite to the thin film depositing surface, of the substrate 2. The substrate 2, due to its high heat conductivity, exhibits almost the same temperature at both of its surfaces. It is therefore possible to accurately measure the temperature of the thin film depositing surface of the substrate by the radiation pyrometer 9 which senses the temperature of the surface of the substrate opposite to the depositing surface. If the substrate temperature is measured directly by contacting a thermocouple to the thin film depositing surface, a measuring error may be caused by influence of the heat radiated from the filament 6. Such an error, however, can be eliminated and a high accuracy of the temperature measurement is attained since the temperature is sensed and measured by the radiation pyrometer 9 which faces the reverse side of the substrate 2.

In order to ensure an electrical insulation, the insulating means 44 are interposed between the cooling means 5 such as copper chill blocks and the power supply electrodes 42. More specifically, the arrangement is such that substrate 2 is received in slits 46 formed in the power supply electrodes 42 and pressing screws 45 are tightened to fix the substrate 2 between the power supply electrodes 42 and the insulating means 44. The insulating means 44 may be formed of an insulating material such as aluminum nitride plate. Although a quartz plate 2 can be used as the material of the insulating means 44, the use of aluminum nitride is preferred because this material exhibits a greater insulation and higher thermal conductivity than quartz. If the cooling means 5 is made of an insulating material or if the surface of the cooling means 5 is insulated, it is not necessary to interpose insulating plates between the cooling means 5 and the electrodes 42.

In view of large electrical currents supplied through the power supply electrodes 42, each power supply electrode 42 has a large cross-sectional area so as to reduce electrical resistance therethrough and is constructed to tightly contact with a large surface area of the substrate 2 so as to reduce the electrical and heat resistance across the contact between the power supply electrode 42 and the substrate 2.

Figure 4:
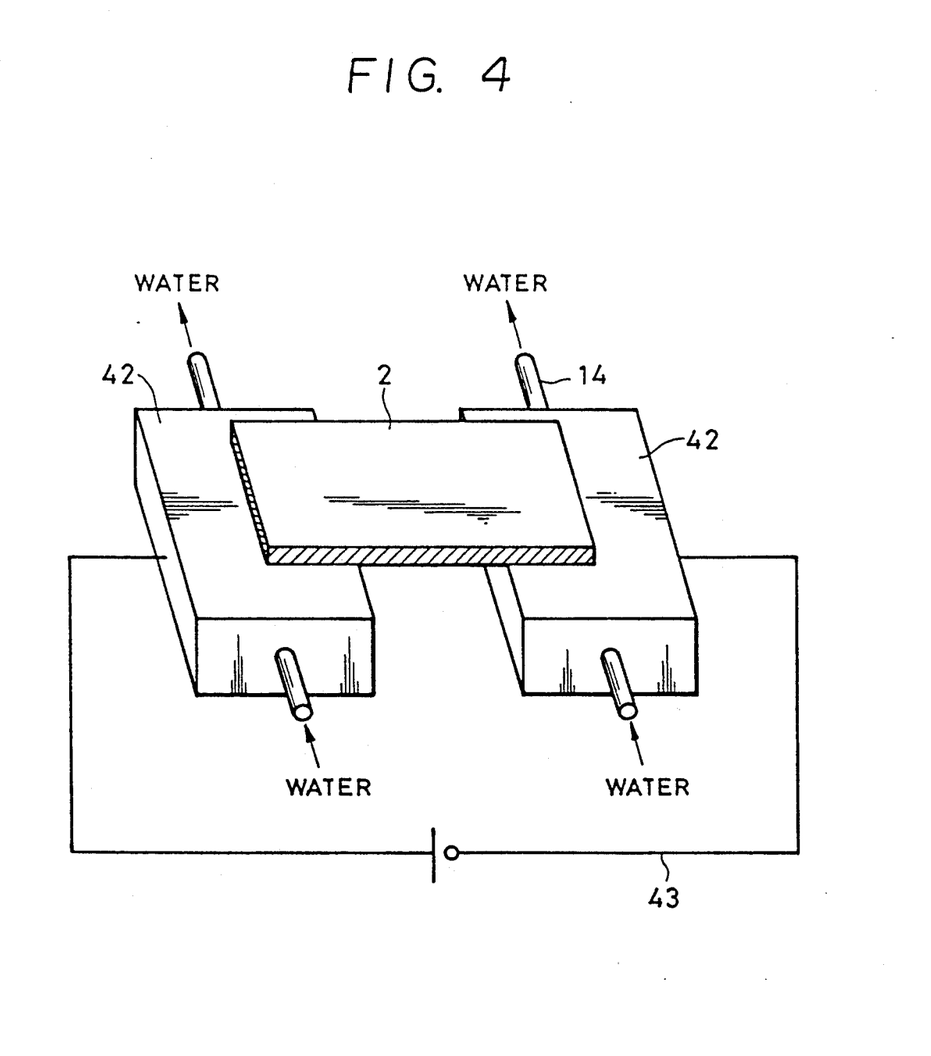
FIG. 4 is a schematic perspective view of another example of the power supply holder of the present invention.

FIG. 4 is a perspective view of another example of the power supply holder.

The power supply holder employs a cooling means 5 through which cooling water is circulated. The substrate 2 is placed on the cooling means 5 such that the whole area of one surface of the substrate 2 contacts the cooling means 5. A pair of electrodes 42 are positioned in contact with two spaced portions of the upper surface of the substrate 2 so that the substrate 2 can be supplied with electric power through these electrodes 42 from a heating electric power supply 43. Thus, the substrate 2 itself functions as the heating means by electrically heating with electric power supplied thereto. When the cooling means 5 is made of an electrically conductive material such as copper, it is necessary that an insulating means 44 is placed between the substrate 2 and the cooling means 5 as illustrated.

EXAMPLE 1

Diamond was deposited by hot filament CVD method, using the apparatus of the invention shown in FIG. 1. In order to attain a large density of diamond nucleation, a silicon plate of 10 mm wide, 20 mm long and 0.5 mm thick, was ground by diamond grains of particle size of about 20 $\mu$m, and used as the substrate 2. A tungsten filament 6 was set at a position about 2 mm apart from the deposition surface. At the same time, a source gas supply nozzle for supplying a source gas, which is a mixture of methane and hydrogen, was set such that the end of the nozzle is about 5 mm spaced apart from the deposition surface. The temperature of the filament during deposition was measured by an optical pyrometer, while the substrate temperature was measured by a sheet-type thermocouple of 0.07 mm thick.

During the deposition, the power supply to the substrate 2 was adjusted so as to maintain the substrate temperature at any desired temperature between 500° and 1200° C. The temperature control could be done with a very small error of less than $\pm 0.5°$ C. The deposition was conducted under the conditions of: a methane flow rate of 5 sccm, hydrogen flow rate of 500 sccm, atmospheric pressure of 30 Torr, filament temperature of 2100° C. and substrate temperature of 850° C.

Deposition of diamond film was confirmed by an observation through a scanning electron microscope and by Raman spectral analysis. A section of the film was observed by the scanning electron microscope for the measurement of the film thickness. The film growth rate was calculated from the film thickness to be 10 $\mu$m/hr. A micro-Raman spectral analysis was conducted on a plurality of points on a section of the film of 20 $\mu$m thick, for the measurement of the peak intensity Id exhibited by diamond and peak intensity Ind exhibited by non-diamond carbon. All these measuring points exhibited the same value of the ratio Ind/Id. The cooling was conducted by circulating cooling water of 25° C. at a flow rate of 3 l/min.

EXAMPLE 2

A description will be given of the result of a test in which diamond was formed on the substrate by CVD process employing a combination of the apparatus shown in FIG. 1 and the power supply holder of the type shown in FIG. 3. The CVD process was carried out by using, as the source gas, CH$_4$ gas diluted with hydrogen gas to 1% concentration. The source gas was supplied from the nozzle at a rate of 200 sccm onto the substrate 2 placed in the reaction vessel 1 in which an atmosphere of 30 Torr or lower pressure was maintained. The command substrate temperature was 870° C. A silicon plate of 10 mm wide, 20 mm long and 0.5 mm thick was used as the substrate. In this example, the temperature of the substrate surface could be controlled with a very small error of ±0.2° C. with respect to the command temperature of 870° C., by virtue of the heating of the substrate with electrical current supplied to the substrate itself.

The diamond film formed by this process exhibited a resistivity of $10^{13}$ to $10^{14}$ Ωm and a hardness Hv of 8000 to 9000 which well approximates those of natural diamonds, over the entire area of the film.

From the foregoing description, it will be understood that the apparatus of the present invention makes it possible to form a thin film of uniform thickness and quality.

Although the invention has been described through its specific forms, it is to be understood that the described embodiments are not exclusive. For instance, although hot filament CVD method is used in the first and second embodiments, the apparatus of the present invention can equally be applied to other CVD processes such as plasma-assisted CVD and to PVD (physical vapor deposition) processes such as sputtering PVD, and thin films of superior quality can be obtained also in such applications.

What is claimed is:

1. A process for forming a thin film, comprising the steps of:

providing a substrate in a vessel;

heating said substrate;

supplying a source gas to said vessel, decomposing said source gas, and exhausting the resultant gas from said vessel; wherein said thin film is deposited on said substrate by chemical vapor deposition of said decomposed source gas while controlling fluctuations in substrate temperature by measuring the temperature of said substrate and simultaneously and separately heating and cooling said substrate during deposition in response to said temperature.

2. The process according to claim 1, wherein during said deposition said temperature is maintained substantially constant.

3. The process of claim 1, wherein during said deposition said temperature is maintained substantially constant.

* * * * *

UNITED STATES PATENT AND TRADEMARK OFFICE
CERTIFICATE OF CORRECTION

PATENT NO. : 5,225,245

DATED : July 6, 1993

INVENTOR(S) : Tomohiro OHTA; Eiichi KONDOH; Tohru MITOMO; Kenichi OTSUKA and Hiroshi SEKIHASHI It is certified that error appears in the above-identified patent and that said Letters Patent is hereby corrected as shown below:

Column 8, Delete the present claim 2 and replace with the following claim 2:

--2. The process according to claim 1, wherein said heating is conducted by electric power and said cooling is conducted by water.--

Signed and Sealed this

Twenty-second Day of March, 1994

*Attest:*

BRUCE LEHMAN

*Attesting Officer*     *Commissioner of Patents and Trademarks*